United States Patent
Goto

(10) Patent No.: US 9,852,888 B2
(45) Date of Patent: Dec. 26, 2017

(54) CIRCULATING COOLING/HEATING DEVICE

(71) Applicant: KELK Ltd., Hiratsuka-shi, Kanagawa (JP)

(72) Inventor: Daisuke Goto, Kanagawa (JP)

(73) Assignee: KELK Ltd., Hiratsuka-shi, Kanagawa (JP)

(*) Notice: Subject to any disclaimer, the term of this patent is extended or adjusted under 35 U.S.C. 154(b) by 110 days.

(21) Appl. No.: 14/655,272

(22) PCT Filed: Nov. 7, 2013

(86) PCT No.: PCT/JP2013/080121
§ 371 (c)(1),
(2) Date: Jun. 24, 2015

(87) PCT Pub. No.: WO2014/103524
PCT Pub. Date: Jul. 3, 2014

(65) Prior Publication Data
US 2016/0196954 A1    Jul. 7, 2016

(30) Foreign Application Priority Data
Dec. 25, 2012  (JP) ................. 2012-281844

(51) Int. Cl.
*H01J 37/32*  (2006.01)
*H01L 21/67*  (2006.01)
*F28D 1/02*   (2006.01)

(52) U.S. Cl.
CPC ...... *H01J 37/32009* (2013.01); *F28D 1/0213* (2013.01); *H01J 37/32431* (2013.01);
(Continued)

(58) Field of Classification Search
CPC .......... H01J 37/32009; H01J 37/32431; H01J 2237/334; H01J 37/32522;
(Continued)

(56) References Cited

U.S. PATENT DOCUMENTS 5,435,379 A    7/1995  Moslehi et al.
6,148,145 A    11/2000 Kadotani
(Continued)

FOREIGN PATENT DOCUMENTS

CN    1759470       4/2006
JP    H07-029967 B2 4/1995
(Continued)

OTHER PUBLICATIONS

Office Action in corresponding Chinese Application No. 201380067968.X, dated Aug. 23, 2016, 10 pages, with English translation.
(Continued)

*Primary Examiner* — Mohammad M Ali
(74) *Attorney, Agent, or Firm* — Fish & Richardson P.C.

(57) ABSTRACT

A circulating cooling/heating device that is configured to cool and heat a circulating fluid supplied to a chamber in plasma-etching equipment includes: a reservoir configured to store the circulating fluid; a pump configured to circulate the circulating fluid between the reservoir and the chamber; a heat exchanger configured to perform heat exchange between the circulating fluid and a cooling water, the heat exchanger being immersed in the circulating fluid stored in the reservoir; and a heater configured to heat the circulating fluid in the reservoir.

12 Claims, 6 Drawing Sheets

(52) U.S. Cl.
CPC .. *H01J 37/32522* (2013.01); *H01J 37/32724* (2013.01); *H01L 21/67069* (2013.01); *H01L 21/67109* (2013.01); *H01J 2237/334* (2013.01)

(58) Field of Classification Search
CPC ......... H01J 37/32724; H01L 21/67069; H01L 21/67109; H01L 21/6706
USPC .............................. 118/728–732; 156/345.18
See application file for complete search history.

(56) References Cited

U.S. PATENT DOCUMENTS

| | | | |
|---|---|---|---|
| 6,157,778 A | 12/2000 | Kadotani | |
| 6,403,491 B1* | 6/2002 | Liu | H01J 37/32522 257/E21.252 |
| 2004/0068997 A1* | 4/2004 | Hirooka | F25B 25/005 62/175 |
| 2007/0272155 A1 | 11/2007 | Nozawa et al. | |
| 2011/0220288 A1* | 9/2011 | Kobayashi | H01J 37/20 156/345.27 |

FOREIGN PATENT DOCUMENTS

| | | |
|---|---|---|
| JP | H09-280756 A | 10/1997 |
| JP | 10-141831 A | 5/1998 |
| JP | 2001-194040 | 7/2001 |
| JP | 2002-022300 A | 1/2002 |
| JP | 2002-168551 A | 6/2002 |

OTHER PUBLICATIONS

Office Action in corresponding Korean Application No. 10-2015-7016087, dated Aug. 4, 2016, 7 pages, with English translation.
International Search Report dated Dec. 17, 2013 for corresponding International Patent Application No. PCT/JP2013/080121, 4 pages.

\* cited by examiner

CIRCULATING COOLING/HEATING DEVICE

CROSS-REFERENCE TO RELATED APPLICATIONS

This application claims priority to International Application No. PCT/JP2013/080121 filed on Nov. 7, 2013, which application claims priority to Japanese Application No. 2012-281844, filed on Dec. 25, 2012. The contents of the above applications are incorporated herein by reference in their entireties.

TECHNICAL FIELD

The present invention relates to a circulating cooling/heating device and, in particular, to a circulating cooling/heating device provided to plasma-etching equipment.

BACKGROUND ART

Semiconductor processing equipment such as plasma-etching equipment with a temperature control device provided on a side thereof has been known (see, for instance, Patent Literature 1). The temperature control device circulates and supplies a circulating fluid with a temperature adjusted to a predetermined temperature to a chamber in the semiconductor processing equipment to adjust the temperature of the chamber to a temperature setpoint. Such a temperature control device includes a circulating cooling/heating device for cooling and heating the circulating fluid.

A circulating cooling/heating device disclosed in Patent Literature 1 has a triple-tube structure and specifically includes an outer tube, an inner tube disposed in the outer tube, and a glass tube disposed in the inner tube. A cooling water flows into and out of the outer tube, whereas a circulating fluid flows into and out of the inner tube. A heating lamp is housed in the glass tube.

With the above arrangement, the circulating fluid entering the inner tube is cooled by heat exchange between the inner tube and the outer tube outside the inner tube or heated by radiation from the heating lamp disposed inside the inner tube, thereby adjusting the temperature of the circulating fluid to a predetermined temperature. The circulating fluid with the adjusted temperature is then pumped from the inner tube to the chamber, and returned to the circulating cooling/heating device after being used to adjust the temperature of the chamber.

CITATION LIST

Patent Literature(s)

Patent Literature 1: JP-A-9-280756

SUMMARY OF THE INVENTION

Problem(s) to be Solved by the Invention

In the circulating cooling/heating device with the triple-tube structure disclosed in Patent Literature 1, the circulating fluid is cooled by the cooling water only via a tube wall of the inner tube, so that the circulating fluid flowing along the tube wall of the inner tube is favorably cooled, whereas the circulating fluid near the center of the inner tube may be unfavorably cooled. Accordingly, in order to reliably cool the circulating fluid even near the center of the inner tube without changing the flow rate of the circulating fluid, the diameter of the outer tube typically has to be increased so that a large amount of cooling water enters to cool the circulating fluid. However, such an increase in the diameter results in an increase in the entire device size.

An object of the invention is to provide a circulating cooling/heating device capable of efficiently cooling a circulating fluid and downsized as a whole.

Means for Solving the Problem(s)

According to a first aspect of the invention, a circulating cooling/heating device configured to cool and heat a circulating fluid supplied to a chamber in plasma-etching equipment, includes: a reservoir configured to store the circulating fluid; a pump configured to circulate the circulating fluid between the reservoir and the chamber; a heat exchanger configured to perform heat exchange between the circulating fluid and a cooling water, the heat exchanger being immersed in the circulating fluid stored in the reservoir; and a heater configured to heat the circulating fluid in the reservoir.

According to a second aspect of the invention, the reservoir includes: a reservoir body in a shape of a bottomed box; and a lid body configured to cover an upside of the reservoir body, and the heat exchanger and the heater are attached to the lid body.

According to a third aspect of the invention, a fluid level sensor is attached to the lid body, the fluid level sensor including a float configured to float on the circulating fluid stored in the reservoir.

According to a fourth aspect of the invention, the reservoir defines therein an air chamber, the air chamber being a space unfilled with the circulating fluid, and the reservoir includes a breather through which the air chamber is in communication with outside of the reservoir.

According to a fifth aspect of the invention, the heat exchanger is connected to an inflow path through which the circulating fluid flows in, and the inflow path is provided with a relief valve configured to release the circulating fluid in the inflow path into the reservoir.

The circulating cooling/heating device of the first aspect includes the heat exchanger in which the circulating fluid is cooled by the cooling water, so that the circulating fluid can be cooled with a cooling efficiency similar to that of a typical device. Further, the heat exchanger is immersed in the circulating fluid in the reservoir, so that the circulating fluid in the heat exchanger can be cooled even through a surface of the heat exchanger, which typically functions as a heat-radiating surface, with an improved cooling efficiency. Further, the heat exchanger is housed in the reservoir, so that it is not necessary to provide an installation space for the heat exchanger outside the reservoir. The circulating cooling/heating device can thus be downsized as a whole.

In the circulating cooling/heating device of the second aspect, the heat exchanger and the heater are attached to the lid body, so that the heat exchanger and the heater can be easily taken out for maintenance purpose by removing the lid body from the reservoir body. Further, since the heat exchanger and the heater are attached to the removed lid body, maintenance on the heat exchanger and the heater can be easily performed in an offline process. It is thus not necessary to perform maintenance on the heat exchanger and the heater when they are installed in the circulating cooling/heating device.

The circulating cooling/heating device of the third aspect includes the fluid level sensor. Therefore, the stored amount of the circulating fluid in the reservoir can be detected and thus, for instance, the reservoir can be appropriately refilled with the circulating fluid. Further, since the fluid level sensor is attached to the lid body, maintenance on the fluid level sensor can be easily performed as in the second aspect.

The circulating cooling/heating device of the fourth aspect includes the air chamber defined in the reservoir. A thermal expansion of the circulating fluid can thus be reliably allowed without, for instance, an accumulator or any member for providing a space with a predetermined capacity disposed in the middle of a circulation path for the circulating fluid, which also contributes to a reduction in the device size.

The circulating cooling/heating device of the fifth aspect includes the relief valve provided to the inflow path for the circulating fluid connected to the heat exchanger. Therefore, in the case of occurrence of a trouble in the flow of the circulating fluid in the heat exchanger, the circulating fluid can be released into the reservoir to restrain damage of the heat exchanger and/or pipes for circulation or influence on the pump. Further, since the relief valve is disposed in the reservoir, the released circulating fluid can immediately flow into the reservoir. Therefore, it is not necessary to elongate a flow path for releasing the circulating fluid into the reservoir, which results in simplification of the device structure.

BRIEF DESCRIPTION OF DRAWING(S)

DESCRIPTION OF EMBODIMENT(S)

An exemplary embodiment of the invention will be described below with reference to the attached drawings.

Figure 1:
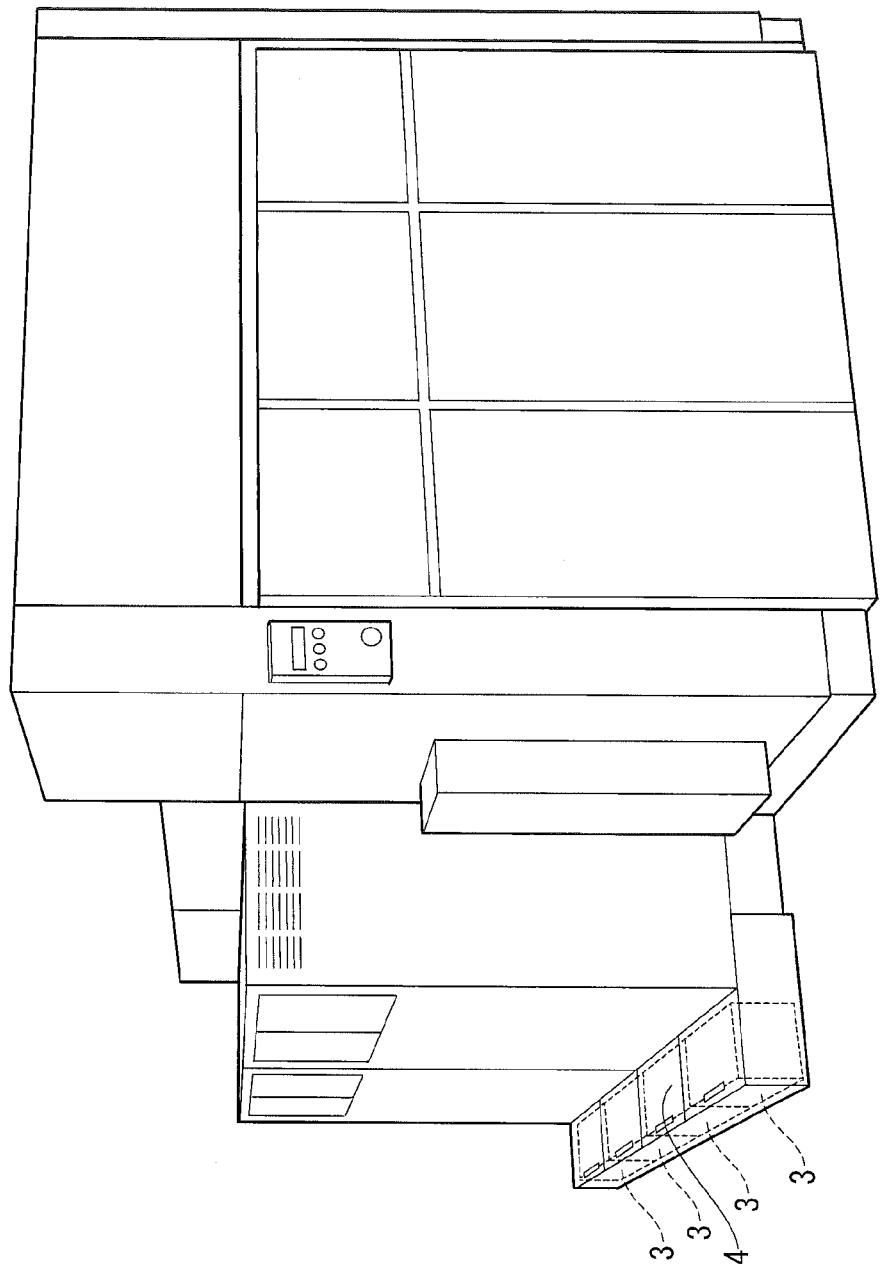
FIG. 1 is a perspective view showing plasma-etching equipment employing a circulating cooling/heating device according to an exemplary embodiment of the invention.
Figure 2:
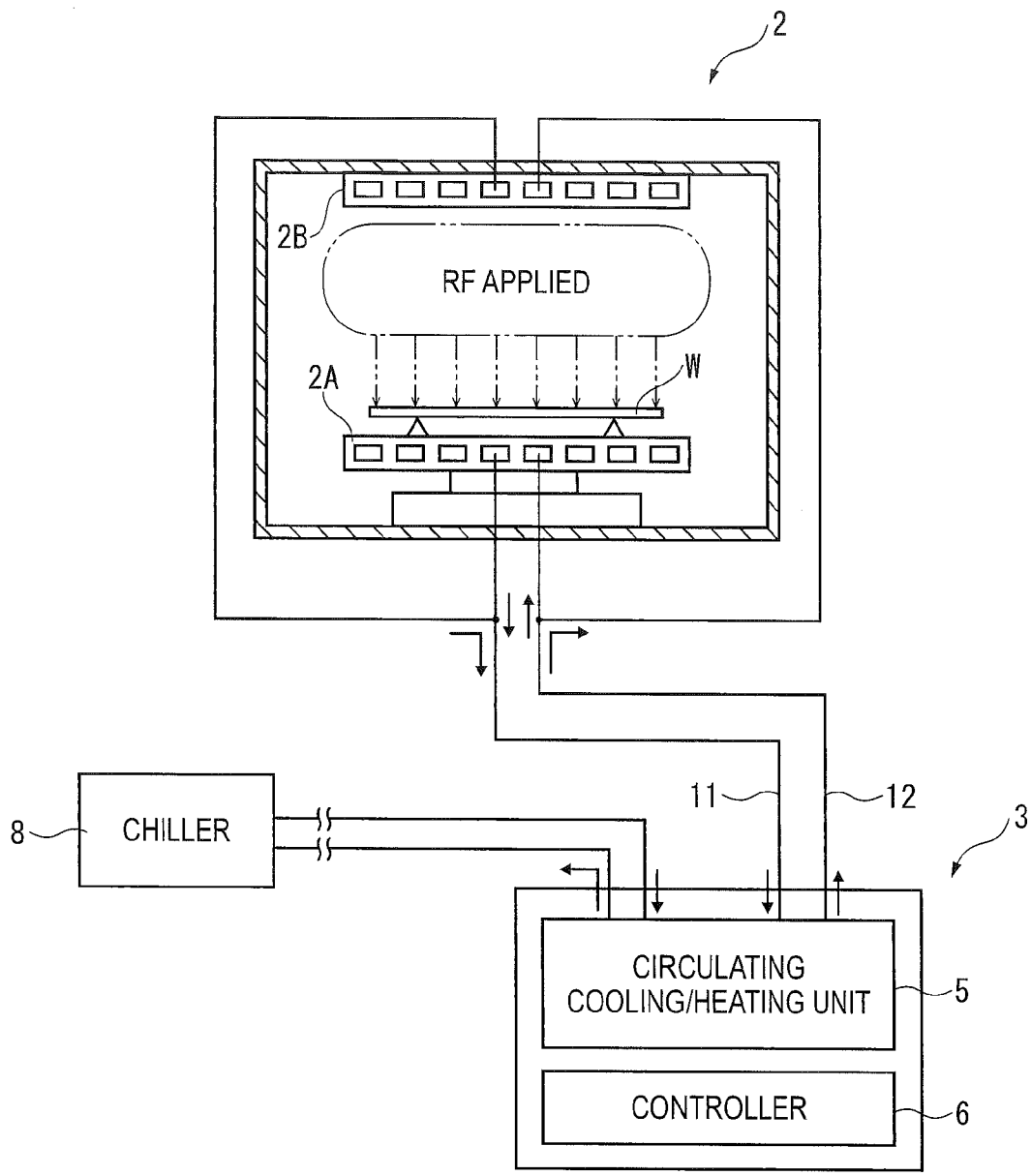
FIG. 2 is a schematic view showing a chamber and a temperature control device in the plasma-etching equipment.

FIG. 1 is a perspective view showing plasma-etching equipment 1 according to the exemplary embodiment. FIG. 2 is a schematic view showing a chamber 2 and a temperature control device 3 in the plasma-etching equipment 1.

General Description of Overall Arrangement of Plasma-Etching Equipment

As shown in FIGS. 1 and 2, the plasma-etching equipment 1, which is equipment performing a plasma-dry process to etch a semiconductor wafer W, includes therein the chamber 2 including a plurality of chambers (only one of them is shown in FIG. 1). The temperature of each of the chambers 2 is adjusted to a predetermined temperature setpoint using a temperature-adjusted circulating fluid supplied from the temperature control device 3. In the exemplary embodiment, the temperature control device 3 includes a plurality of temperature control devices corresponding to the plurality of chambers 2 and is housed in a step 4 for an operator disposed on a side of the plasma-etching equipment 1.

In performing the etching process, the chambers 2 are vacuumed and maintained at a predetermined low pressure. An etching gas (a process gas) is introduced into the chambers 2 in the low-pressure state. The introduced etching gas is turned into plasma to etch the semiconductor wafer W. In performing the above process, the respective temperatures of the chambers 2 are adjusted to the temperature setpoint using the circulating fluid from the temperature control devices 3.

In the exemplary embodiment, the chambers 2 each include a lower electrode 2A on which the semiconductor wafer W is to be mounted, and an upper electrode 2B disposed above the lower electrode 2A, and the circulating fluid flows through an inner path defined in each of the electrodes 2A, 2B to adjust the temperature of each of the chambers 2. In each of the chambers 2, a capacitively coupled plasma is generated by applying an RF (Radio Frequency) electric field between the electrodes 2A, 2B. It should be noted that the chambers 2 may each be configured to generate, for instance, an electron cyclotron resonance plasma, a helicon-wave-excited plasma, an inductively coupled plasma or a microwave-excited surface-wave plasma in place of a capacitively coupled plasma.

Description of Temperature Control Device

Figure 3:
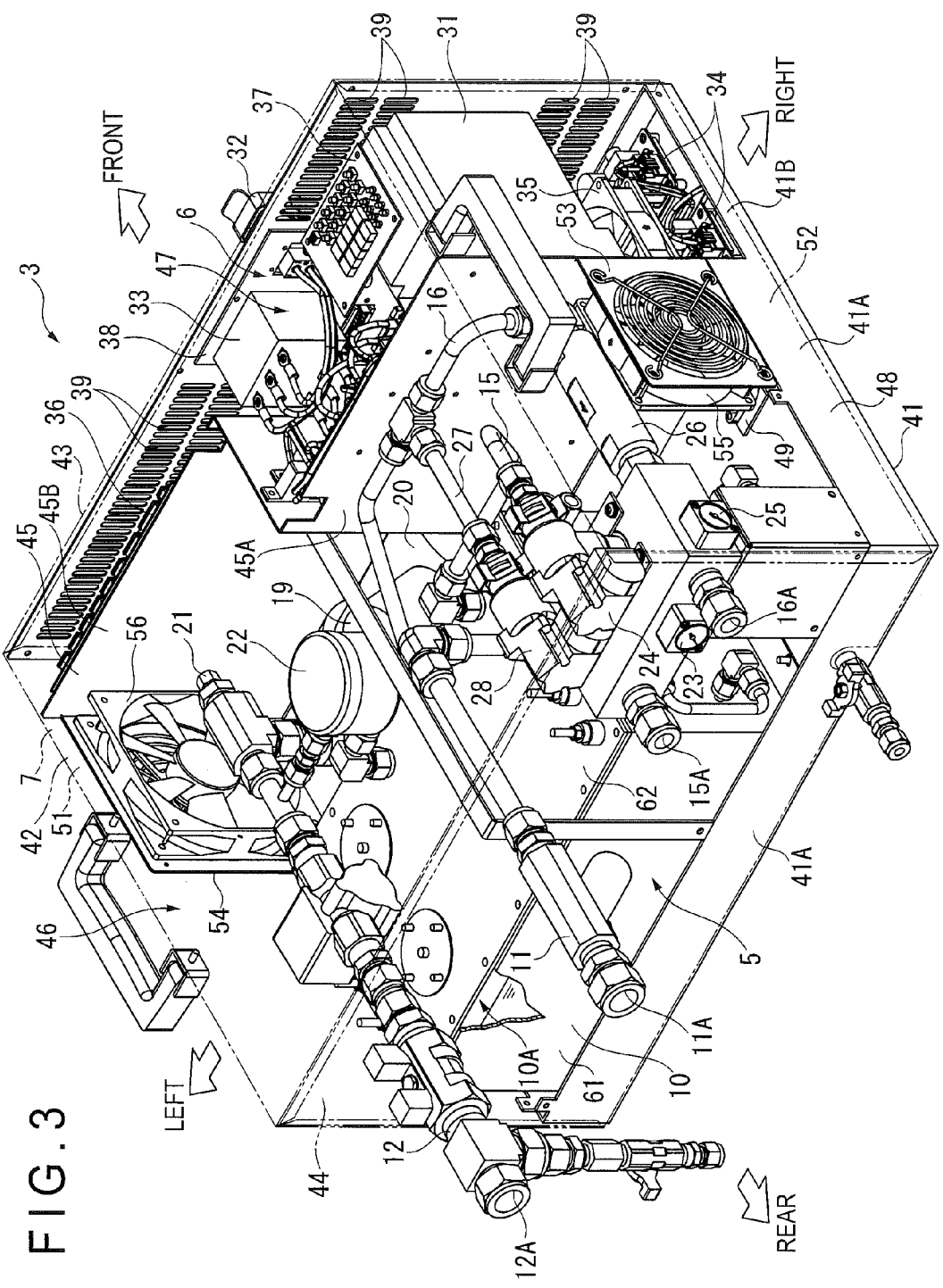
FIG. 3 is a perspective view showing an overall arrangement of the temperature control device.
Figure 4:
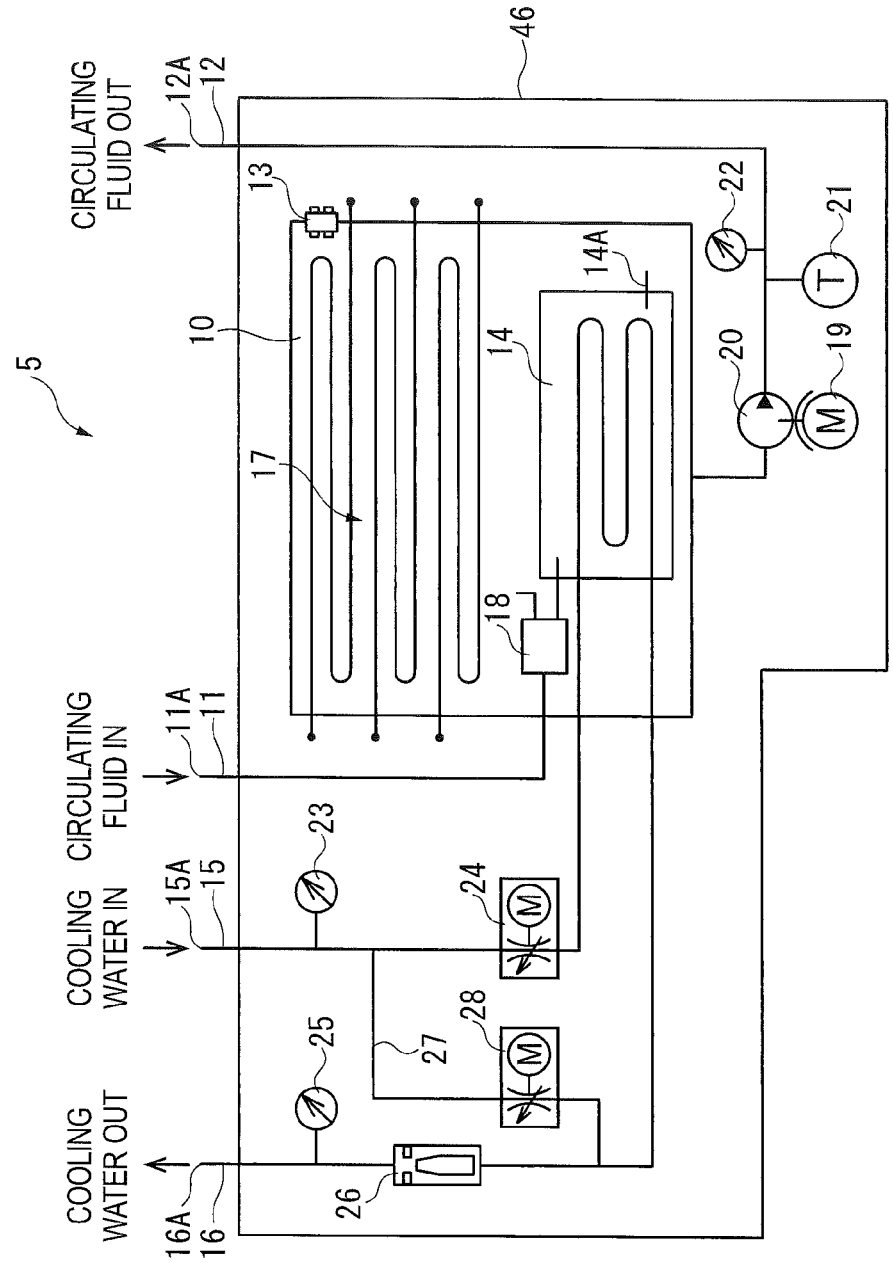
FIG. 4 shows a schematic arrangement and a fluid circuit of the circulating cooling/heating device provided to the temperature control device.

FIG. 3 is a perspective view showing an overall inner arrangement of each of the temperature control devices 3 as viewed from the rear. FIG. 4 shows a schematic arrangement and a fluid circuit of a circulating cooling/heating unit 5 provided to each of the temperature control devices 3.

As shown in FIGS. 3 and 4, the temperature control devices 3 each include: the circulating cooling/heating unit 5 (a circulating cooling/heating device) that cools and heats the circulating fluid circulated between each of the temperature control devices 3 and the corresponding chamber 2; a controller 6 that controls the temperature of the circulating fluid based on a variety of parameters outputted from the circulating cooling/heating unit 5 to control the temperature of each of the chamber 2 to a temperature setpoint; and a housing 7 for housing the circulating cooling/heating unit 5 and the controller 6.

In each of the temperature control devices 3, the circulating cooling/heating unit 5 and the controller 6, which will be described later in detail, are arranged in a front-and-rear positional relationship on the same level. Therefore, in the case of maintenance on the circulating cooling/heating unit 5 and the controller 6 of one of the temperature control devices 3, a large part of the circulating cooling/heating unit 5 and the controller 6 can be exposed by removing a part of the housing 7 of the one of the temperature control devices 3, so that the maintenance can be easily performed from above. Further, the maintenance can be performed without pulling the one of the temperature control devices 3 from a housing portion defined in the step 4 to a wider area, so that it is not necessary to provide a large installation space in consideration of the necessity of such a wider area.

It should be noted that the circulating cooling/heating unit 5 of each of the temperature control devices 3 in the exemplary embodiment is connected to a chiller 8. The chiller 8 supplies and circulates a cooling water with a constant temperature to the circulating cooling/heating unit 5. The cooling water is used to cool the circulating fluid in the circulating cooling/heating unit 5. The circulating fluid is a fluorine coolant such as GALDEN (a trademark of Ausimont K.K.) and Fluorinert (a trademark of 3M Company).

Description of Circulating Cooling/Heating Unit

The circulating cooling/heating unit 5 occupies a rear area defined in each of the temperature control devices 3. When the circulating cooling/heating unit 5 is disposed in the rear area, a pipe for the circulating fluid and a pipe for the cooling water extending rearward from the circulating cooling/heating unit 5 can be arranged under a body of the plasma-etching equipment 1 and connected to the chamber 2 or the chiller 8. The pipes are thus not exposed outside the plasma-etching equipment 1, so that it is not necessary to prepare a space for pipe arrangement in addition to the installation space for the plasma-etching equipment 1.

Further, since the circulating cooling/heating unit 5 is close to the chamber 2 and the like, the pipes may be shortened to reduce the usage of the circulating fluid. As a result, a reservoir 10 storing the circulating fluid and a heat exchanger 14 (both described later) can be reduced in capacity or size, thereby considerably downsizing the circulating cooling/heating unit 5 and, consequently, each of the temperature control devices 3. Each of the temperature control devices 3 can thus be reliably housed in a narrow installation space defined in the step 4.

Specifically, the circulating cooling/heating unit 5 includes the reservoir 10 storing the circulating fluid. The reservoir 10 is connected to an inflow path 11 and an outflow path 12, which respectively include an inflow portion 11A and an outflow portion 12A for the circulating fluid. The reservoir 10 has therein a clearance space above the circulating fluid stored in the reservoir 10. The clearance space, which is unfilled with the circulating fluid, defines an air chamber 10A as shown in a partially cutaway view of the reservoir 10 in FIG. 3.

Volume contraction or volume expansion of the circulating fluid resulting from cooling or heating the circulating fluid is acceptable due to a change in the capacity of the air chamber 10A. A breather 13 is provided on a side of the reservoir 10 to prevent an excessive pressure change resulting from a change in the capacity of the air chamber 10A. The breather 13 admits or releases air into or out of the air chamber 10A in accordance with the pressure of the air chamber 10A to maintain the pressure of the air chamber 10A within a predetermined range.

In the reservoir 10, the heat exchanger 14 is housed and constantly immersed in the circulating fluid. The inflow path 11 for the circulating fluid has an end connected to the heat exchanger 14 in the reservoir 10. The heat exchanger 14 has an outlet 14A for discharging the circulating fluid into the reservoir 10. The heat exchanger 14 performs thermal exchange between the circulating fluid and the cooling water to cool the circulating fluid. The heat exchanger 14 is thus connected to an inflow path 15 and an outflow path 16, which respectively include an inflow portion 15A and an outflow portion 16A for the cooling water.

Since the heat exchanger 14 is immersed in the circulating fluid, the circulating fluid entering the heat exchanger 14 is also cooled from the outside of the heat exchanger 14 by the cooled circulating fluid. Further, since the heat exchanger 14 is housed in the reservoir 10, it is not necessary to provide an installation space for the heat exchanger 14 outside the reservoir 10 even though the size of the reservoir 10 has to be slightly increased. The circulating cooling/heating unit 5 can thus be reliably downsized as a whole even though the size of the reservoir 10 itself is slightly increased.

In the reservoir 10, a heater 17 including three sheathed heaters is also housed. Terminals 17A of the sheathed heaters are exposed on an upside of the reservoir 10, and the sheathed heaters generate heat with an electric power supplied through the terminals 17A. The circulating fluid is heated by the heat generated by the sheathed heaters.

In the reservoir 10, the inflow path 11 for the circulating fluid is provided with a relief valve 18. When the flow of the circulating fluid into the heat exchanger 14 is restricted for any reason and the pressure of the circulating fluid in the heat exchanger 14 exceeds a predetermined level, the relief valve 18 is opened to release the circulating fluid into the reservoir 10.

At the outside of the reservoir 10, the outflow path 12 for the circulating fluid is provided with a pump 20 driven by a motor 19. Further, a temperature sensor 21 and a pressure gauge 22 are provided downstream of the pump 20. When the pump 20 is driven, the circulating fluid is circulated between the circulating cooling/heating unit 5 and the corresponding chamber 2. It should be noted that the outflow path 12 has a base end opened in the reservoir 10 at an appropriate position determined depending on, for instance, actual installation positions of the heat exchanger 14 and the heater 17.

Similarly, at the outside of the reservoir 10, the inflow path 15 for the cooling water is provided with a pressure gauge 23 disposed near the inflow portion 15A and a proportional valve 24 disposed downstream of the pressure gauge 23. The outflow path 16 is provided with a pressure gauge 25 disposed near the outflow portion 16A and a constant flow valve 26 disposed upstream of the pressure gauge 25. An upstream side of the inflow path 15 relative to the proportional valve 24 and an upstream side of the outflow path 16 relative to the constant flow valve 26 are in communication with each other through a bypass 27. The bypass 27 is provided with a proportional valve 28. The opening degree of a diaphragm mechanism of each of the proportional valves 24, 28 can be changed to adjust the flow rate of the cooling water flowing through the heat exchanger 14, thereby adjusting the cooling performance of the heat exchanger. The cooling water is circulated using a pump (not shown) in the chiller 8 (FIG. 2).

The pump 20 for the circulating fluid is disposed between the controller 6 and the reservoir 10 arranged at front and rear sides. The pressure gauge 22 for the circulating fluid is disposed above the reservoir 10. The proportional valves 24, 28, the constant flow valve 26 and the pressure gauges 23, 25 for the cooling water are compactly arranged at a side of the reservoir 10.

Description of Controller

The controller 6 controls, for instance, the drive of the pump 20, the opening degree of each of the proportional valves 24, 28, and ON/OFF of the heater 17 based on a temperature detected by the temperature sensor 21 and other various parameters. The controller 6 occupies a front area in the temperature control device 3 as shown in FIG. 3.

The controller 6 includes: an SSR (Solid State Relay) 30 (FIG. 5) functioning as a switch for switching ON/OFF of the heater 17; and an inverter 31 provided with a driving circuit for the pump 20. The controller 6 further includes, for instance, a power connector 32, connectors for connecting various interface cables, a power switch box 33, a power source board 34, a cooling fan 35 for cooling the inverter 31, a CPU (Central Processing Unit) board 36, and an operation panel 37.

Typically, a heater is provided in each electrode of a chamber, and ON/OFF of the heater is controlled by a temperature control device. This is because, for instance, in view of the fact that heat is absorbed from the circulating fluid in the middle of a long pipe extending from a circulating cooling/heating device, the circulating fluid typically has to be further heated using the heater in each electrode. However, with the above arrangement, the temperature of the circulating fluid can be adjusted up to approximately 90 degrees C. at the highest. Further, the typical temperature control device requires a costly filter for reducing noise generated by the heater in each electrode.

In contrast, in the exemplary embodiment, the pipe for circulation is shortened and the usage of the circulating fluid is reduced, so that even the heater 17 with a relatively small size is sufficient to adjust the temperature of the circulating fluid up to approximately 150 degrees C., as described above. Accordingly, it is not necessary to provide a heater in each of the electrodes 2A, 2B of each of the chambers 2, so that the production cost of temperature control device 3 can be reliably reduced.

Description of Housing

As shown in FIG. 3, the housing 7 includes: a bottom panel 41 on which the circulating cooling/heating unit 5 and the controller 6 are mounted; an upper cover 42 (shown by two-dot chain lines in FIG. 3) covering an upper side and lateral sides of each of the circulating cooling/heating unit 5 and the controller 6; a front cover 43 fixed to the bottom panel 41 and the upper cover 42 to cover a front of the temperature control device 3; a rear cover 44 (shown by two-dot chain lines in FIG. 3) similarly fixed to the bottom panel 41 and the upper cover 42 to cover a rear of the temperature control device 3; and a partitioning panel 45 dividing a space in the temperature control device 3 into front and rear parts. A space behind the partitioning panel 45 is defined as a circulation chamber 46 where the circulating cooling/heating unit 5 is disposed, whereas a space in front of the partitioning panel 45 is defined as a control chamber 47 where the controller 6 is provided. In other words, the chambers 46, 47 are present on the same level.

The bottom panel 41 includes a rise portion 41A formed along a periphery of the bottom panel 41 corresponding to the circulation chamber 46. A height H1 of the rise portion 41A is higher than a height H2 of a rise portion 41B formed along a periphery corresponding to the control chamber 47. Specifically, the bottom panel 41 defines a pan 48 surrounded by the rise portion 41A along a bottom-side periphery thereof corresponding to the circulation chamber 46. A bottom of the pan 48 is provided with a fluid-leakage sensor 49 that detects the circulating fluid.

The circulating fluid and the cooling water flow into and out of the circulation chamber 46. In the case where the circulating fluid and the cooling water leak in the circulation chamber 46, the leakage can be received by the pan 48. As a result, the circulating fluid and the cooling water can be prevented from leaking into the control chamber 47 to affect an electronic component or the like or from leaking outside. Further, when the leakage of the circulating fluid and the cooling water onto the pan 48 is detected by the fluid-leakage sensor 49, the leakage is displayed on the operation panel 37, a display provided to the plasma-etching equipment 1, or the like.

The upper cover 42 has an upper surface 51 and right and left side surfaces 52, 52, and can be upwardly removed using right and left handles after being unfixed from the bottom panel 41, the front cover 43 and the rear cover 44. The operation panel 37 is attached to the upper surface 51 of the upper cover 42 at a position corresponding to the control chamber 47. The upper surface 51 and the side surfaces 52 of the upper cover 42 are provided with openings (not shown) at positions corresponding to the pressure gauges 22, 25 of the circulating cooling/heating unit 5 so that the pressure gauges 22, 25 can be read even when the upper cover 42 is attached.

The front cover 43 is attached with the power connector 32, a signal transmission/reception connector, the power switch box 33 and the like via a plate 38. The front cover 43 is provided with a large number of slits 39 . . . for releasing heat generated by electric or electronic components of the controller 6. The slits 39 are also provided to the side surfaces 52 of the upper cover 42 and the rear cover 44.

The rear cover 44 is provided with a plurality of openings for avoiding interference with the inflow portion 11A and the outflow portion 12A for the circulating fluid and the inflow portion 15A and the outflow portion 16A for the cooling water as well as an opening allowing the pressure gauge 23 on the inflow path 15 to be visible.

The partitioning panel 45, which includes a first planar portion 45A and a second planar portion 45B, is in a shape of a crank in a plan view. The SSR 30, the inverter 31, the power switch box 33, the power source board 34, the cooling fan 35, the operation panel 37 and the like are disposed in a wider installation space defined in the control chamber 47 by the first planar portion 45A. In contrast, in a narrower installation space defined in the control chamber 47 by the second planar portion 45B, a CPU board 36 and the like are disposed.

In the circulation chamber 46, a narrower installation space is defined behind the wider installation space of the control chamber 47 by the first planar portion 45A, and the proportional valves 24, 28, the constant flow valve 26, the pressure gauges 23, 25 for the cooling water, and the like are disposed in the narrower installation space. In contrast, in the circulation chamber 46, a wider installation space is defined behind the narrower installation space of the control chamber 47 by the second planar portion 45B, and the reservoir 10, the pump 20, the temperature sensor 21, the pressure gauge 22 and the like are disposed in the wider installation space.

Right and left sides of the partitioning panel 45 are respectively integral with rectangular attachment pieces 53, 54 bent relative to the first and second planar portions 45A, 45B. A suction fan 55 is attached to the attachment piece 53 and disposed in the narrower installation space of the circulation chamber 46. A exhaust fan 56 is attached to the attachment piece 54 and disposed in the wider installation space of the circulation chamber 46. The side surfaces 52 of the upper cover 42 are provided with openings through which cooling air flows in and out at positions corresponding to the fans 55, 56.

Description of Flow of Cooling Air in Circulation Chamber

Figure 5:
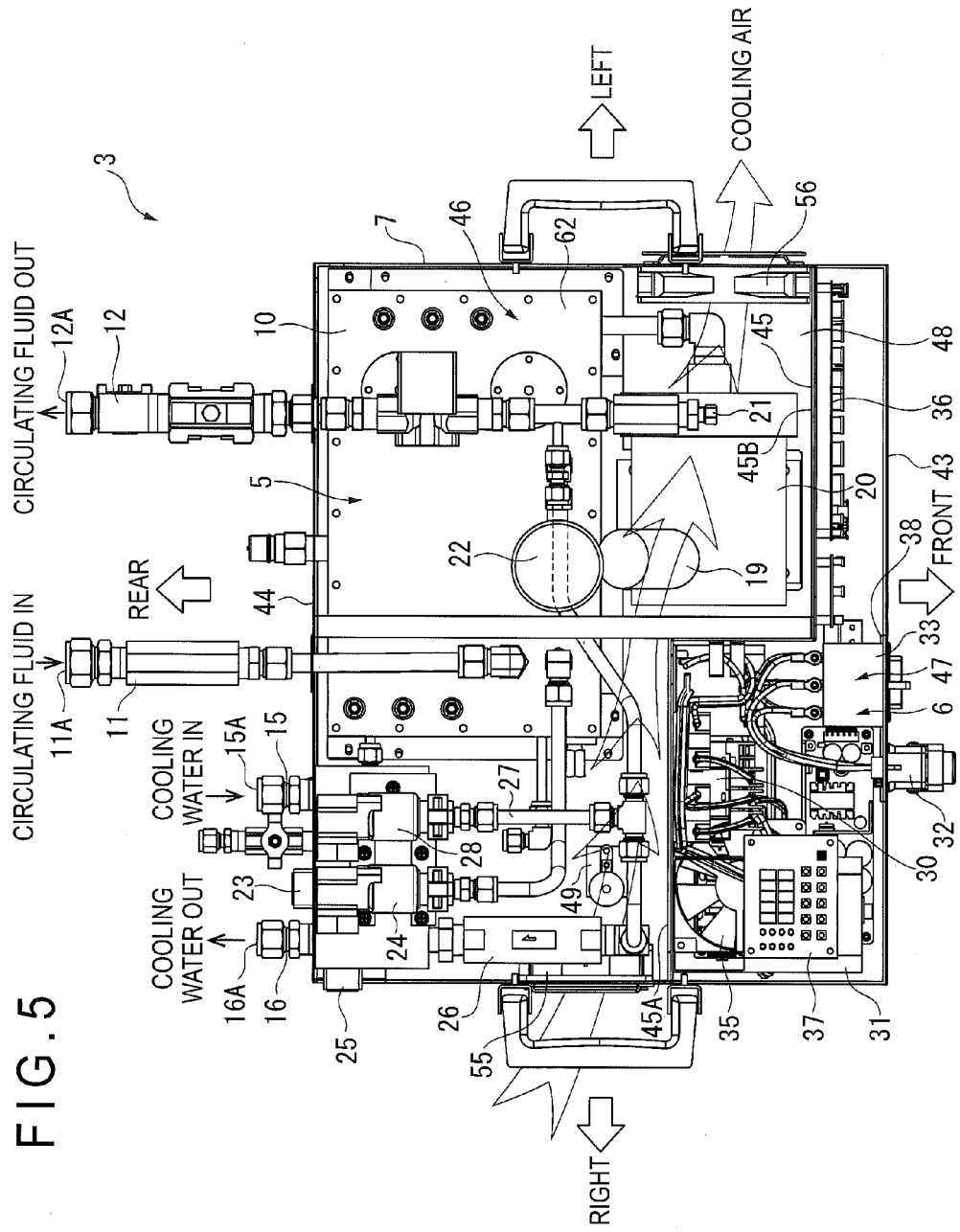
FIG. 5 is a plan view showing an interior of the temperature control device.

FIG. 5 is a plan view showing an interior of the temperature control device 3. In FIG. 5, a flow of the cooling air through the circulation chamber 46 is shown by inserted arrows.

As shown in FIG. 5, the cooling air sucked from the outside of the temperature control device 3 through the suction fan 55 provided at the right side of the temperature control device 3 first flows left along a rear surface of the first planar portion 45A of the partitioning panel 45. Heat-generating components such as the SSR 30 and the inverter 31 are attached on a front surface of the first planar portion 45A, and thus the rear surface of the first planar portion 45A functions as a heat-radiating surface that radiates generated heat. Therefore, when the cooling air flows along the rear surface, heat radiated through the first planar portion 45A can be immediately released outside the housing 7 so as not to stay in the circulation chamber 46.

The cooling air then enters the wider installation space of the circulation chamber 46, and flows between the second planar portion 45B and the reservoir 10. As a result, the motor 19 and the pump 20 driven by the motor 19 are cooled by the cooling air. The cooling air is then discharged outside the temperature control device 3 through the exhaust fan 56 provided at the left side of the temperature control device 3.

Detailed Description of Reservoir

Figure 6:
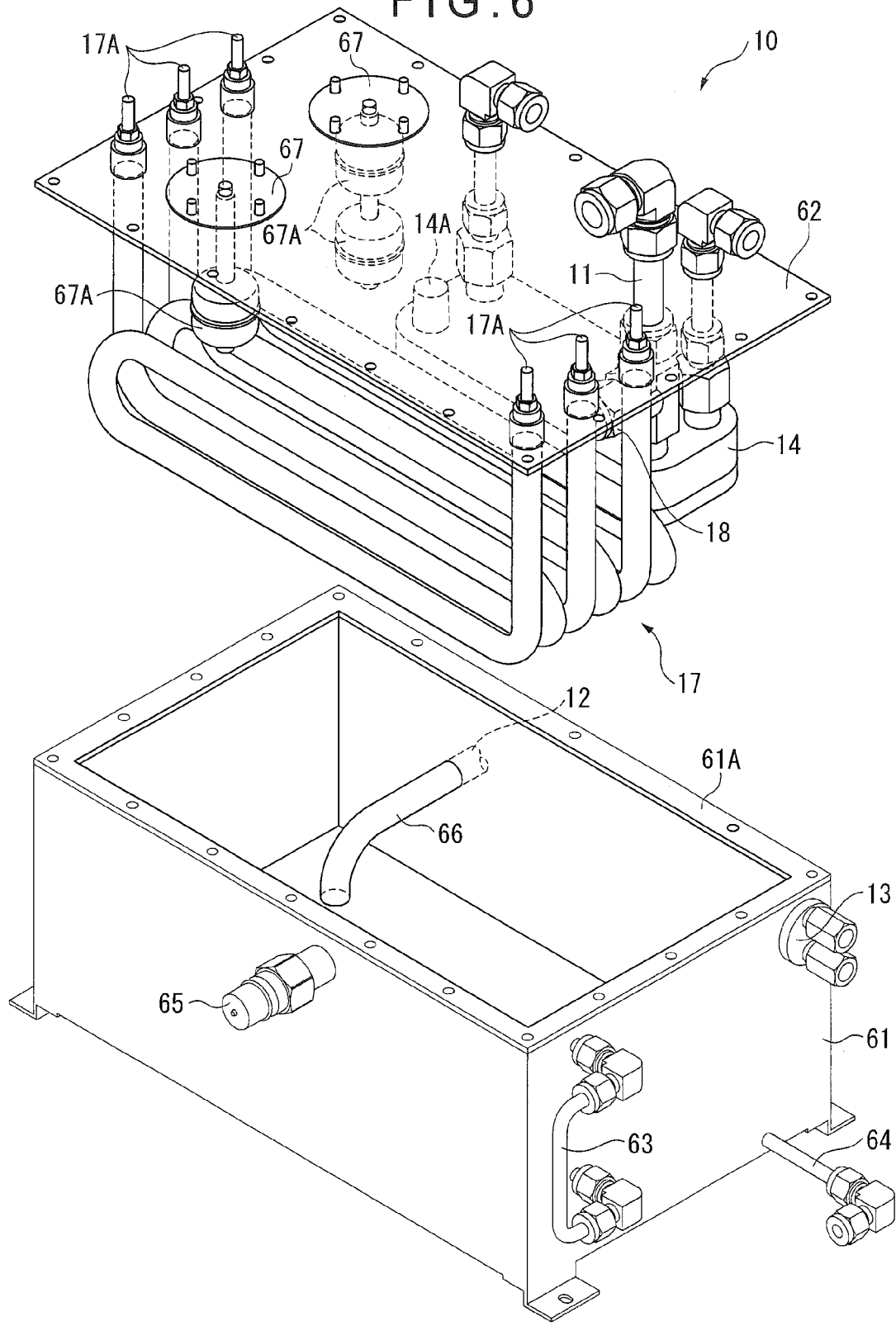
FIG. 6 is an exploded perspective view showing a fluid reservoir of the circulating cooling/heating device.

FIG. 6 is an exploded perspective view showing the reservoir 10. The reservoir 10 will be described below in detail with reference to FIG. 6.

As shown in FIG. 6, the reservoir 10 includes: a reservoir body 61 in the shape of a bottomed box; and a plate-shaped lid body 62 covering an upside of the reservoir body 61. The upside of the reservoir body 61 is provided with an inner flange 61A formed in conformity with a periphery of the reservoir body 61. The lid body 62 is fixed to the inner flange 61A with an appropriate fastener such as a screw. A seal material is interposed between the inner flange 61A and a lower surface of the lid body 62 as needed.

A side surface of the reservoir body 61 is provided with not only the breather 13 but also a leveler 63 for showing an amount of the circulating fluid stored in the reservoir 10 and a drain pipe 64 for discharging the circulating fluid. A rear surface of the reservoir body 61 is provided with a refill port 65 for refilling the reservoir 10 with the circulating fluid. The inside of a front surface of the reservoir body 61 is provided with a suction tube 66, which is the base end of the outflow path 12. The circulating fluid in the reservoir 10 is sucked out through the suction tube 66 by the pump 20.

The heat exchanger 14 and the heater 17 are attached to the lid body 62 and hang from the lower surface of the lid body. A pair of fluid level sensors 67, 67 are attached to the lid body 62 in the same manner as the heat exchanger 14 and the heater 17. The fluid level sensors 67 each include a float 67A floating on the circulating fluid. Based on the position of the float 67A outputted from each of the fluid level sensors 67, it can be detected whether or not the fluid level of the circulating fluid (a stored amount) reaches a lower limit or an upper limit. When the stored amount of the circulating fluid falls below either the lower limit or exceeds the upper limit, the operation panel 37 or the like shows that the stored level falls below the lower limit or exceeds the upper limit.

The heat exchanger 14 and the heater 17 are attached to the lid body 62 of the reservoir 10. Therefore, the heat exchanger 14 and the heater 17 are taken out along with the lid body 62 by unfixing the lid body 62 from the reservoir body 61 and separating the inflow paths 11, 15 and the outflow paths 12, 16 from joints so that maintenance on the heat exchanger 14 and the heater 17 can be easily performed in an offline process. Further, the lid body 62 is removed along with the heat exchanger 14 and the heater 17 and thus the upside of the reservoir body 61 is widely opened, so that maintenance on an interior of the reservoir body 61 can also be easily performed.

Incidentally, it should be understood that the scope of the invention is not limited to the above-described exemplary embodiment(s) but includes modifications and improvements compatible with the invention.

For instance, in the exemplary embodiment, the relief valve 18 is provided in the reservoir 10 to release the circulating fluid into the reservoir 10. Alternatively, the relief valve 18 may be provided outside the reservoir 10, for instance, right downstream of the pump 20 so that the released circulating fluid can be returned into the reservoir 10 through a release bypass.

In the exemplary embodiment, the air chamber 10A is defined in the reservoir 10 and the breather 13 is provided to the reservoir 10. Alternatively, an accumulator or the like may be provided to the circulation path in place of the air chamber 10A and the breather 13. However, the accumulator, which requires an installation space with a predetermined size, is not suitable in view of a reduction in the device size. Accordingly, it is preferable that the air chamber 10A and the breather 13 be provided to the reservoir 10 as in the exemplary embodiment.

In the exemplary embodiment, the heat exchanger 14, the heater 17 and the fluid level sensors 67 are attached to the lid body 62, but may alternatively be attached to the reservoir body 61 without departing the scope of the invention. However, in view of the fact that maintenance can be easily performed when the heat exchanger 14, the heater 17 and the fluid level sensors 67 are attached to the lid body 62, it is preferable that these components be attached to the lid body 62 as in the exemplary embodiment.

In the exemplary embodiment, it is described that the circulating cooling/heating unit 5 is housed in the housing 7 of the temperature control device 3 along with the controller 6, but the circulating cooling/heating device according to the invention may include another housing for the circulating cooling/heating unit 5 independent of a housing for the controller 6.

The invention claimed is:

1. A circulating cooling/heating device configured to cool and heat a circulating fluid supplied to a chamber in plasma-etching equipment, the circulating cooling/heating device comprising:
   a reservoir configured to store the circulating fluid;
   a pump configured to circulate the circulating fluid between the reservoir and the chamber;
   a heat exchanger configured to perform heat exchange between the circulating fluid and a cooling water, the heat exchanger being immersed in the circulating fluid stored in the reservoir and comprising an outlet configured to release the circulating fluid to an inside of the reservoir; and
   a heater configured to heat the circulating fluid in the reservoir,
   wherein the heat exchanger is connected to a first inflow path and configured to receive the circulating fluid through the first inflow path, and
   wherein a second inflow path is branched from the first inflow path and configured to directly release the circulating fluid from the first inflow path into the reservoir.

2. The circulating cooling/heating device according to claim 1, wherein the reservoir comprises:
   a reservoir body in a shape of a bottomed box; and
   a lid body configured to cover an upside of the reservoir body, and
   the heat exchanger and the heater are attached to the lid body.

3. The circulating cooling/heating device according to claim 2, wherein a fluid level sensor is attached to the lid body, the fluid level sensor comprising a float configured to float on the circulating fluid stored in the reservoir.

4. The circulating cooling/heating device according to claim 1, wherein
the reservoir defines therein an air chamber, the air chamber being a space unfilled with the circulating fluid, and
the reservoir comprises a breather through which the air chamber is in communication with outside of the reservoir.

5. A circulating cooling/heating device configured to cool and heat a circulating fluid supplied to a chamber in plasma-etching equipment, the circulating cooling/heating device comprising:
a reservoir configured to store the circulating fluid;
a pump configured to circulate the circulating fluid between the reservoir and the chamber;
a heat exchanger positioned within the reservoir and configured to be immersed in the circulating fluid stored in the reservoir, the heat exchanger being configured to receive a cooling water through a cooling water inflow path and to perform heat exchange between the received cooling water and the circulating fluid; and
a heater configured to heat the circulating fluid in the reservoir,
wherein the heat exchanger is further configured to receive the circulating fluid through a first inflow path that is separate from the cooling water inflow path, and
wherein the first inflow path includes a second inflow path that is configured to receive circulating fluid from the first inflow path and to release the received circulating fluid into the reservoir.

6. The circulating cooling/heating device according to claim 5, wherein the reservoir comprises:
a reservoir body in a shape of a bottomed box; and
a lid body configured to cover an upside of the reservoir body, and
the heat exchanger and the heater are attached to the lid body.

7. The circulating cooling/heating device according to claim 6, wherein a fluid level sensor is attached to the lid body, the fluid level sensor comprising a float configured to float on the circulating fluid stored in the reservoir.

8. The circulating cooling/heating device according to claim 5, wherein
the reservoir defines therein an air chamber, the air chamber being a space unfilled with the circulating fluid, and
the reservoir comprises a breather through which the air chamber is in communication with outside of the reservoir.

9. The circulating cooling/heating device according to claim 5, wherein the heat exchanger is configured to perform heat exchange between the received cooling water and the circulating fluid stored in the reservoir.

10. The circulating cooling/heating device according to claim 5, wherein the heat exchanger is configured to perform heat exchange between the received cooling water and the circulating fluid received by the heat exchanger through the first inflow path.

11. The circulating cooling/heating device according to claim 5, wherein the heat exchanger is configured to perform heat exchange (i) between the received cooling water and the circulating fluid stored in the reservoir and (ii) between the received cooling water and the circulating fluid received by the heat exchanger through the first inflow path.

12. The circulating cooling/heating device according to claim 5, wherein the heat exchanger includes an outlet configured to release the circulating fluid to an inside of the reservoir.

\* \* \* \* \*